(12) United States Patent
Bedjaoui (10) Patent No.: US 10,865,104 B2
(45) Date of Patent: Dec. 15, 2020

(54) PROCESS FOR ENCAPSULATION OF A MICROELECTRONIC DEVICE BY EASILY MANIPULATED THIN OR ULTRATHIN SUBSTRATES

(71) Applicant: COMMISSARIAT À L'ÉNERGIE ATOMIQUE ET AUX ÉNERGIES ALTERNATIVES, Paris (FR)

(72) Inventor: Messaoud Bedjaoui, Voreppe (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/258,832

(22) Filed: Jan. 28, 2019

(65) Prior Publication Data
US 2019/0233281 A1    Aug. 1, 2019

(30) Foreign Application Priority Data

Jan. 30, 2018   (FR) ...................................... 18 50733

(51) Int. Cl.
*B29C 65/48*    (2006.01)
*B29C 65/00*    (2006.01)
(Continued)

(52) U.S. Cl.
CPC ........ *B81C 1/00285* (2013.01); *B81B 7/0038* (2013.01); *G06F 13/42* (2013.01);
(Continued)

(58) Field of Classification Search
CPC .......... H01M 10/0436; H01M 10/052; H01M 10/0585; H01M 2/08; H01M 6/40;
(Continued)

(56) References Cited

U.S. PATENT DOCUMENTS

2008/0062506 A1*   3/2008   Sah .................. G02F 1/167
                                                            359/296
2008/0252962 A1*  10/2008   Makubo ............ G02F 1/167
                                                            359/296
(Continued)

FOREIGN PATENT DOCUMENTS

EP          2065929 A1    6/2009
EP          3159302 A1    4/2017
(Continued)

OTHER PUBLICATIONS

French Search Report for Application No. 1850733 dated Oct. 22, 2018.

*Primary Examiner* — Philip C Tucker
*Assistant Examiner* — Brian R Slawski
(74) *Attorney, Agent, or Firm* — Pearne & Gordon LLP (57) ABSTRACT

Process for encapsulation of a microelectronic device comprising the following steps in sequence: supply a support substrate comprising a first principal face on which a microelectronic device is placed, a second principal face, and a lateral face, deposit a bonding layer on the first principal face of the substrate, position an encapsulation cover comprising a first principal face, a second principal face, and a lateral face, on the bonding layer, deposit a lateral protection layer on: the lateral face and the periphery of the second principal face of the support substrate, the lateral face and the periphery of the second principal face of the encapsulation cover, the lateral protection layer delimiting a protected zone, thinning of the second principal face of the support substrate and/or the second principal face of the encapsulation cover outside the protected zone.

8 Claims, 6 Drawing Sheets

(51) Int. Cl.
| | |
|---|---|
| B32B 17/10 | (2006.01) |
| B32B 37/12 | (2006.01) |
| B32B 37/18 | (2006.01) |
| B32B 37/00 | (2006.01) |
| H01M 2/08 | (2006.01) |
| B81C 1/00 | (2006.01) |
| H01M 10/052 | (2010.01) |
| H01L 23/29 | (2006.01) |
| H01L 21/56 | (2006.01) |
| G06F 13/42 | (2006.01) |
| H01M 10/04 | (2006.01) |
| H01L 23/31 | (2006.01) |
| H01M 2/02 | (2006.01) |
| B81B 7/00 | (2006.01) |
| H01M 10/058 | (2010.01) |
| H01M 10/0562 | (2010.01) |
| H01M 6/18 | (2006.01) |
| H01M 6/40 | (2006.01) |
| C03B 5/00 | (2006.01) |

(52) U.S. Cl.
CPC ............ *H01L 21/56* (2013.01); *H01L 21/561* (2013.01); *H01L 23/291* (2013.01); *H01L 23/3135* (2013.01); *H01M 2/0202* (2013.01); *H01M 2/028* (2013.01); *H01M 2/08* (2013.01); *H01M 10/0436* (2013.01); *H01M 10/052* (2013.01); *H01M 10/058* (2013.01); B29C 65/48 (2013.01); B29C 66/03 (2013.01); B29C 66/45 (2013.01); *B32B 17/10036* (2013.01); *B32B 17/1099* (2013.01); *B32B 17/10146* (2013.01); *B32B 17/10155* (2013.01); *B32B 17/10908* (2013.01); *B32B 37/1207* (2013.01); *B32B 37/18* (2013.01); B32B 2037/1253 (2013.01); B81B 2207/09 (2013.01); B81C 2203/0181 (2013.01); *C03B 5/00* (2013.01); *H01M 6/18* (2013.01); *H01M 6/40* (2013.01); *H01M 10/0562* (2013.01); H01M 2002/0297 (2013.01)

(58) Field of Classification Search
CPC ....... B32B 17/06; B32B 17/064; B32B 17/10; B32B 17/10036; B32B 17/10146; B32B 17/10155; B32B 17/10807; B32B 17/10899; B32B 17/10908; B32B 17/1099; B32B 37/1207; B32B 37/18; B32B 2037/1253; B29C 65/00; B29C 65/48; B29C 65/483; B29C 65/4835; B29C 66/00; B29C 66/03; B29C 66/41; B29C 66/45; B29C 66/452
USPC ... 156/60, 99, 100, 153, 154, 155, 278, 280, 156/295, 297, 299, 300, 307.1, 307.7; 428/426, 688; 257/E21.499, E21.502, 257/E21.505, E29.324, E29.295; 313/511; 349/158; 359/296; 445/24; 438/51, 106, 107, 112, 118, 127
See application file for complete search history.

(56) References Cited

U.S. PATENT DOCUMENTS

| | | | |
|---|---|---|---|
| 2008/0309867 A1 | 12/2008 | Kampstra | |
| 2009/0050990 A1 | 2/2009 | Aono et al. | |
| 2009/0262294 A9 | 10/2009 | Templier | |
| 2010/0157412 A1* | 6/2010 | Lee | G02F 1/167 359/296 |
| 2010/0208188 A1* | 8/2010 | Tsai | H01L 51/5246 349/153 |
| 2010/0258882 A1 | 10/2010 | Magnee et al. | |
| 2011/0048611 A1 | 3/2011 | Carre et al. | |
| 2012/0087002 A1* | 4/2012 | Hsieh | G02F 1/167 359/296 |
| 2012/0120364 A1* | 5/2012 | Wu | G02F 1/13454 349/153 |
| 2012/0212797 A1* | 8/2012 | Luan | G02F 1/167 359/296 |
| 2014/0375906 A1* | 12/2014 | Wu | G02F 1/1368 349/12 |
| 2015/0316828 A1* | 11/2015 | Lai | G02F 1/133345 359/296 |
| 2015/0348861 A1* | 12/2015 | Chia | H01L 21/561 257/774 |
| 2017/0113925 A1 | 4/2017 | Rey | |
| 2017/0213976 A1* | 7/2017 | Luo | H01L 51/56 |
| 2017/0373350 A1 | 12/2017 | Bedjaoui et al. | |
| 2018/0309097 A1 | 10/2018 | Bedjaoui et al. | |

FOREIGN PATENT DOCUMENTS

| | | | |
|---|---|---|---|
| FR | 2879889 A1 | 6/2006 | |
| FR | 2893750 A1 | 5/2007 | |
| JP | 55157719 A | * 12/1980 | |
| JP | 04036725 A | * 2/1992 | |

* cited by examiner

PROCESS FOR ENCAPSULATION OF A MICROELECTRONIC DEVICE BY EASILY MANIPULATED THIN OR ULTRATHIN SUBSTRATES

CROSS-REFERENCE TO RELATED APPLICATIONS

This application claims priority from French Patent Application No. 18 50733 filed on Jan. 30, 2018. The content of this application is incorporated herein by reference in its entirety.

TECHNICAL DOMAIN AND STATE OF PRIOR ART

This invention relates to a process for encapsulating a microelectronic device by easily manipulated thin or ultrathin substrates.

This invention also relates to a microelectronic structure obtained by such a process.

In recent years, microelectronic components and more particularly all-solid-state microbatteries in thin layers have become essential in the development of onboard smart systems. These smart systems are used for example in "Internet of Things", energy storage, energy recovery, organic and inorganic electronics applications, and even in the power field.

The development of these smart systems must lead towards miniaturisation of micro-electronic components, and in parallel the use of increasingly thin support substrates. The substrates used for these systems must be thin (typically with a thickness of less than 100 µm) or even ultrathin (thickness of less than 50 µm).

Microelectronic devices, and particularly lithium microbatteries, have very high sensitivity to atmospheric elements such as oxygen and water vapour. Therefore these devices must be encapsulated to guarantee their electronic or electrochemical integrity, and also their mechanical integrity in the long term. Performances of encapsulation systems are frequently expressed in terms of Water Vapour Transmission Rate (WVTR) or Oxygen Transmission Rate (OTR). In the special case of lithium microbatteries, the required WVTR and OTR levels are of the order of $10^{-4}$ g/m$^2$/d and $10^{-4}$ cm$^3$/m$^2$/d respectively.

In practice, to satisfy criteria for miniaturisation of microelectronic devices, the cover also needs to be thin or ultrathin, while providing a sufficient protection level.

A first solution to facilitate the manipulation of thin and ultrathin substrates is to use fragile "front-end" substrates in association with a stiffener substrate, also called the rigid or stiffener support to facilitate their manipulation and their handling during technological steps. However, this solution requires the use of a bonding step, either direct without an intermediate layer (for example as described in document FR-A-2893750), or indirect with an intermediate layer with a dielectric, metallic, polymeric or other nature (for example as described in document US-A-2011/0048611), and a step to desolidarise the thin substrate from its rigid support at the end of the process, for example, by inserting a blade between the substrate and the temporary support or applying a shear or tension force on the substrate. Furthermore, some temporary bonding solutions are not adapted to microelectronic devices, for which processes require thermal budgets with temperatures of more than 300° C.

Finally, such bonding and desolidarisation steps lead to an increase in fabrication costs and/or production times.

A second solution consists of using a chemical or mechanical method of thinning standard rigid substrates at the end of device manufacturing processes. The chemical thinning technique is a more gentle technique than the mechanical thinning technique. However, this solution has several disadvantages for steps to be performed at the end of the process (so called "back-end" steps). The major problem relates to the manipulation of substrates after thinning. The initially rigid substrates become very fragile after thinning and it is difficult to manipulate them to perform subsequent component cutting-out steps and/or after integration with other components.

PRESENTATION OF THE INVENTION

Consequently, one purpose of this invention is to propose an encapsulation process that overcomes the disadvantages according to prior art, and particularly to propose a process for encapsulating microelectronic devices sensitive to air and/or high temperatures with a thin or ultrathin substrate and/or a thin or ultrathin cover, the process being easy to implement, not requiring a desolidarisation step as in prior art, and particularly such that the thin or ultrathin substrate and/or the thin or ultrathin cover can be easily manipulated.

This purpose is achieved by a process for encapsulation of a microelectronic device placed on a support substrate, with an encapsulation cover comprising the following successive steps:

a) supply a support substrate made of a first material, comprising a first principal face on which a microelectronic device is placed, a second principal face opposite the first principal face, and a lateral face, b) deposit a bonding layer made of a second material on the first principal face of the substrate, around the microelectronic device, c) position an encapsulation cover made of a third material, comprising a first principal face, a second principal face opposite the first principal face, and a lateral face on the bonding layer, so as to fix the encapsulation cover on the support substrate so as to encapsulate the microelectronic device, d) deposit a lateral protection layer made of a fourth material on the lateral face of the support substrate, on the lateral face of the encapsulation cover, around the periphery of the second principal face of the encapsulation cover, and around the periphery of the second principal face of the support substrate, the lateral protection layer delimiting a protected zone, e) thinning of the second principal face of the support substrate and/or the second principal face of the encapsulation cover outside the protected zone, by chemical etching.

The process according to the invention is simple to implement and requires few technological steps. The process according to the invention does not include any temporary solidarisation and desolidarisation steps. At the end of the encapsulation process, the microelectronic device is encapsulated firstly with a substrate that may be thin or ultrathin, and secondly with a cover that may be thin or ultrathin.

Thin means a thickness of less than 200 µm, and preferably less than 100 µm, and ultrathin means a thickness of less than 50 µm.

The thinning process can reduce the thickness of the substrate and/or the cover while keeping a gripping zone around the periphery of the substrate and the cover. The structure finally obtained can easily be transferred to cutting-out equipment so that microelectronic devices can be separated.

Thinning is done by chemical etching. These etching conditions are better controlled than mechanical etching conditions.

The process according to this invention can give miniaturised devices for which the microelectronic devices are protected from air and its oxidants.

Advantageously, the first material and/or the third material are chosen from among glass and silicon. These materials have good barrier properties.

According to a first advantageous variant, the first material and the third material are identical. The support substrate and the encapsulation cover can be thinned simultaneously and at the same etching rate, for example by immersing or spraying the assembly with a chemical etching solution. Thinning can be controlled as a function of the immersion or spraying time and the chemical composition of the liquids used.

According to a second advantageous variant, the first material and the third material are different. It is possible to etch only the encapsulation cover or the support substrate, or to etch them at different rates.

According to one particularly advantageous embodiment, during step b), the bonding layer entirely covers the microelectronic device.

According to another particularly advantageous embodiment, during step b), the bonding layer forms a sealing bead around the microelectronic device.

Advantageously, the second material and/or the fourth material is a polymer material chosen from among epoxides, ethers, polysiloxanes, acrylics, one of their copolymers, and polyethylene teraphthalate.

Advantageously, after step e), the thickness of the encapsulation cover (400) and/or the support substrate (200) is/are less than or equal to 100 µm, and preferably less than 50 µm.

Advantageously, the protection layer covers the periphery of the first principal face of the support substrate and/or the periphery of the first principal face of the encapsulation cover, preferably over a length of between 1 mm and 5 mm. Advantageously, the lateral protection layer covers the periphery of the second principal face of the support substrate and/or the periphery of the second principal face of the encapsulation cover, preferably over a length of between 1 mm and 5 mm.

Advantageously, the microelectronic component is an electrochemical device such as a lithium microbattery.

Advantageously, several microelectronic devices, identical or different, are positioned on the first principal face of the support substrate and/or on the first principal face of the encapsulation cover.

The process according to the invention enables several configurations in terms of the number and positions of microelectronic devices. For example, two microbatteries can be stacked.

The invention also relates to a microelectronic structure obtained using the process as defined above, comprising:
- a microelectronic device, for example an electrochemical device such as a lithium microbattery,
- a support substrate made of a first material, comprising a first principal face on which the microelectronic device is placed, a second principal face opposite the first principal face, and a lateral face,
- a bonding layer made of a second material, placed on the first principal face of the substrate, around the microelectronic device,
- an encapsulation cover made of a third material, comprising a first principal face, a second principal face opposite the first principal face, and a lateral face, fixed on the bonding layer, and positioned so as to encapsulate the microelectronic device,
- a lateral protection layer made of a fourth material covering the lateral face of the support substrate, the lateral face of the encapsulation cover, the periphery of the second principal face of the encapsulation cover, and the periphery of the second principal face of the support substrate, the lateral protection layer delimiting a protected zone,
the thickness of the support substrate and/or the encapsulation cover outside the protected zone being less than the thickness of the support substrate and/or the manipulation cover at the protected zone, respectively.

Characteristics related to the process are applicable to the microelectronic structure.

Such a structure is easy to manipulate to perform subsequent cutting out steps and/or after integration with other microelectronic components.

BRIEF DESCRIPTION OF THE DRAWINGS

This invention will be better understood after reading the following description and the appended drawings on which.

The different parts shown on the figures are not necessarily all at the same scale, to make the figures more easily understandable.

The different possibilities (variants and embodiments) must be understood as not being mutually exclusive and possibly being combined with each other.

DETAILED PRESENTATION OF PARTICULAR EMBODIMENTS

The process for encapsulation of at least one microelectronic component 300, for example, sensitive to air (to dioxygen and water vapour), placed on a support substrate 200, with an encapsulation cover 400, will now be described. The process comprises the following successive steps:

a) supply a support substrate 200 made of a first material, comprising a first principal face 201 on which a microelectronic device 300 is placed, a second principal face 202 opposite the first principal face 201, and a lateral face, b) deposit a bonding layer 500 made of a second material, on the first principal face 201 of the substrate 200, around the microelectronic device 300, c) position an encapsulation cover 400, made of a third material, comprising a first principal face 401, a second principal face 402 opposite the first principal face 401, and a lateral face on the bonding layer 500, so as to fix the encapsulation cover 400 on the support substrate 200, by means of the bonding layer 500, and so as to encapsulate the microelectronic device 300, d) deposit a lateral protection layer 600 made of a fourth material, at the same time on the lateral face of the support substrate 200, on the lateral face of the encapsulation cover 400, around the periphery of the second principal face 402 of the encapsulation cover 400, and around the periphery of the second principal face 202 of the support substrate 200, the lateral protection layer 600 delimiting a protected zone, e) thinning of the second principal face 202 of the support substrate 200 and/or the second principal face 402 of the encapsulation cover 400 outside the protected zone, by chemical etching.

After step e), the support substrate 200 and/or the encapsulation cover 400 have been thinned, for example to a thickness of less than 200 μm, preferably to a thickness of less than 100 μm while having an unetched gripping zone in the zone protected by the lateral protection layer, making it easy to manipulate them.

Support Substrate 200 and Encapsulation Cover 400:

The support substrate 200, also called the host substrate or support substrate, supplied in step a), is preferably a rigid substrate.

The encapsulation cover 400, supplied in step c), is preferably a rigid encapsulation cover.

For example, the thicknesses of the rigid substrate and/or the encapsulation cover are more than 200 μm, for example 500 μm to 1 mm. For example, they may be 500 μm thick.

Rigid means any support that can easily be used in microelectronics with a thickness of more than 200 μm. For example, the thicknesses of the substrate 200 and/or the encapsulation cover 400 are initially more than 250 μm, for example 500 μm. Preferably, the thicknesses of the substrate 200 and the cover 400, supplied in steps a) et c), are initially more than 200 μm and both are thinned during step e) or during step e) and a subsequent step.

The substrate 200 and the encapsulation cover 400 can have identical or different thicknesses. The thickness of the cover can be less than the thickness of the substrate 200 or vice versa. This possible configuration can be used to make microelectronic devices for which the encapsulation cover is thinner than the substrate 200 or vice versa.

Figure 1:
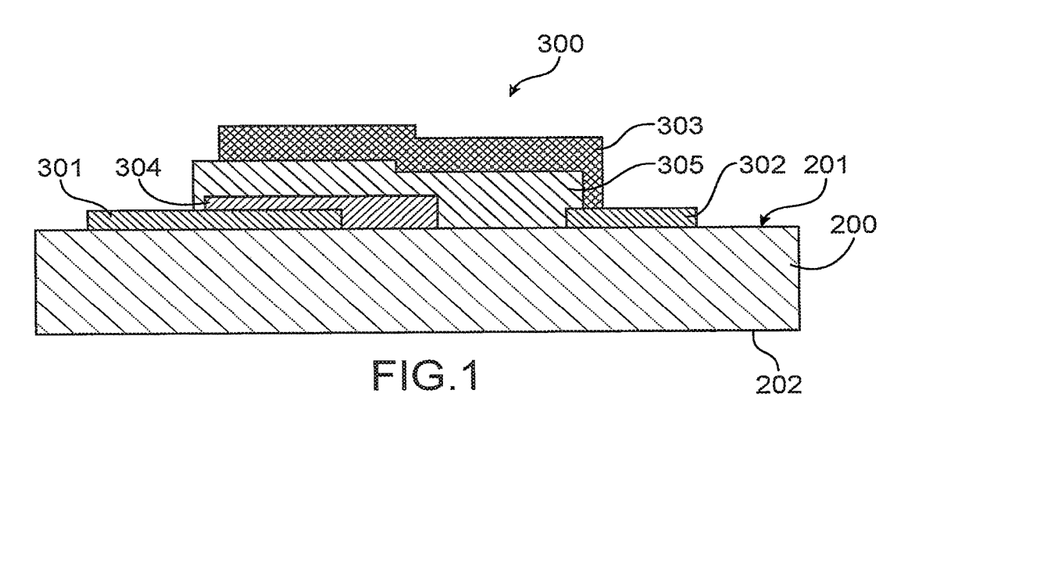
FIG. 1 is a schematic sectional and side representation of a microbattery on a support substrate, according to one particular embodiment of the invention.
Figure 2:
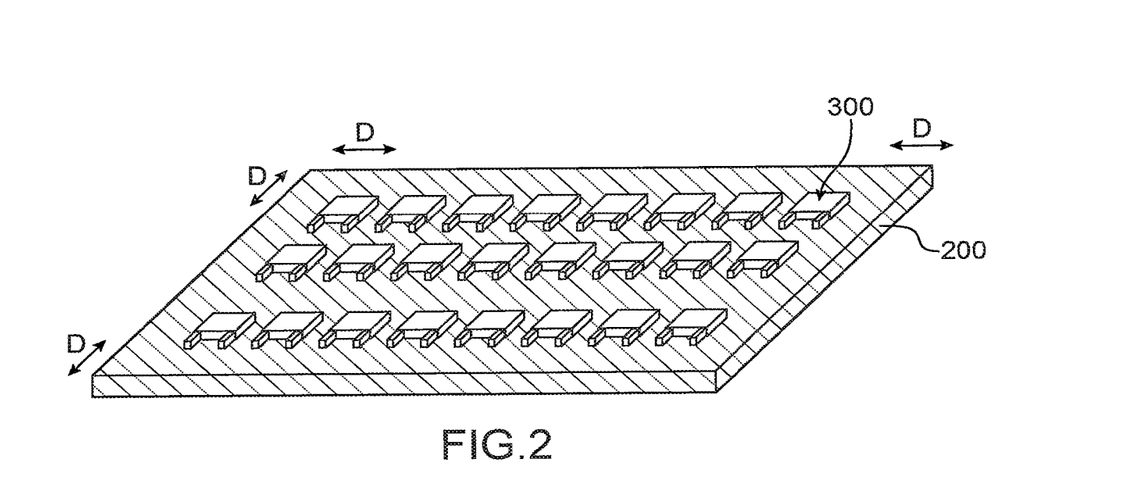
FIG. 2 is a schematic three-dimensional representation of a support substrate on which several microelectronic devices are placed, according to another particular embodiment of the invention.

As shown on FIGS. 1 and 2, the substrate 200 comprises a first principal face 201, and a second principal face 202, opposite the first principal face of the substrate. The first principal face comprises at least one microelectronic component 300. It is called the active face. The substrate also comprises a lateral face from the first principal face to the second principal face.

The cover 400 comprises a first principal face 401 and a second principal face 402, opposite the first principal face 401, and a lateral face from the first principal face 401 to the second principal face 402. Electronic devices that are identical to or different from those on the host substrate can be placed on the first principal face 401.

The substrate 200 and the encapsulation cover 400 can have identical or different geometric shapes. For example, circular type wafer formats or sheet formats, in other words rectangular formats, can be used.

The support substrate 200 is made of a material identical to or different from the encapsulation cover.

The substrate 200 and/or the encapsulation 400 cover advantageously have the performances required for encapsulation of lithium microbatteries. They were produced using a material with WVTR and OTR barrier levels equal to not more than $10^{-4}$ g/m$^2$/d and $10^{-4}$ cm$^3$/m$^2$/d respectively to guarantee sufficient sealing values of the sealing cell from air and water vapour.

The support substrate 200 and the encapsulation cover 400 can be chosen from among glasses, silicon (monocrystalline or polycrystalline), ceramics, mica, quartz. They are preferably made of glass. They may be made of glass from the same family or different families.

The glasses used may be borosilicates (such as D263® LA, D263® M, D263® T, MEMpax® or Borofloat® marketed by the SCHOTT® company), derivatives of borosilicates such as alkali-free borosilicate glasses (AF32®, AF45, Corning® Willow, etc.) or alkaline earth boro-aluminosilicate glasses (Corning Lotus™, EAGLE XG® . . . ).

Preferably, the cover 400 is transparent to laser wavelengths classically used to fix sealing beads (typically about 940 nm for glass paste sealing beads). Transparent means that the cover allows at least 50% of light emitted by the laser to pass, so as to heat the sealing bead through the cover 400.

Preferably, the thicknesses of the support substrate 200 and the encapsulation cover 400 are identical and they are made of the same material.

Microelectronic Device 300 to be Encapsulated:

The process can be used to simultaneously encapsulate one or several microelectronic devices 300. The thickness of the microelectronic device 300, or microelectronic component, varies from 5 μm to 30 μm, and preferably from 10 to 15 μm.

One or several electronic devices 300 with the same nature or different natures can be placed on the first principal face 201 of the substrate 200. This configuration makes it possible to make functional stacks by 3D integration.

The encapsulation cover 400 may be a passive or active element, i.e. the first principal face 401 of the cover 400 may comprise microelectronic devices 300 of the same nature as the substrate 200 or of a different nature, capable of performing other functions.

The support substrate 200 and/or the encapsulation cover 400 may comprise one or several microelectronic devices 300 to improve electrochemical performances by putting microelectronic devices in parallel or in series. The microelectronic devices may for example be chosen from among microbatteries, capacitors, super-capacitors, photovoltaic devices, transistors, antennas or any other device considered to be necessary for making connected objects.

Advantageously, microelectronic devices of the substrate and the covers are placed facing each other so that they can be associated using a 3D stack approach.

A microelectronic device or component 300 consists, for example, of a MEMS (micro-electromechanical system), a MOEMS (micro-opto-electromechanical system), or an infrared microdetector, or even a transistor. More generally, a microelectronic component means any device that will be encapsulated under a controlled atmosphere.

Subsequently, even if the description in particular refers to a microbattery, and more particularly to a lithium microbattery, the invention can be transposed to any micro-electronic component requiring protection against oxidants. For example, it could be a capacitive stack or an electrochromic component.

The microelectronic component 300, in this case the microbattery is placed on one of the faces 201 (first principal face) of the substrate 200. As represented on FIG. 1, the microbattery comprises cathodic 301 and anodic 302 current collectors placed on the substrate 200. Two active layers, one forming the negative electrode 303 and the other forming the positive electrode 304, are separated by an electrolyte layer 305. Each active layer 303, 304 is in contact with one of the current collectors 301, 302.

The current collectors 301, 302 are advantageously metallic. For illustration, they may be made of titanium, gold, aluminium, platinum or tungsten.

The positive electrode 304 (cathode) is made of a material with good electronic and ionic conductivity (for example TiOS, $TiS_2$, LiTiOS, $LiTiS_2$, $LiCoO_2$, $V_2O_5$, etc.). A positive electrode made of cobalt oxide will be chosen in preference. This type of cathode is considered to one of the highest performance layers for microbatteries and is also one of the most highly stressed during fabrication steps. Mechanical stresses generated after formation of the cathodic layer (coefficient of thermal expansion between $10 \times 10^{-6}/°$ C. and $15 \times 10^{-6}/°$ C. and a Young's modulus between 100 and 500 GPa) can have an influence on the behaviour of rigid substrates once they have been thinned.

The electrolyte 305 is an electronic insulator with high ionic conductivity (for example LiPON, LiPONB, LiSiCON, etc.).

The negative electrode 303 (anode) is a layer that can be made of metallic lithium or a lithiated material.

Optionally and depending on the configuration, the active layers can be protected by a primary encapsulation system, not represented, comprising one or several elementary barrier layers, the main role of which is to guarantee the integrity of microbattery devices during the different phases of the process.

The microbattery will be made using techniques known to a person skilled in the art.

The microelectronic devices 300 are placed outside the peripheral contour of the support substrate and/or the encapsulation cover to protect them during the etching step. Advantageously, this geometric distance D from the edge of the support substrate and/or the encapsulation cover will be chosen to be equal to at least twice the initial thickness of the substrate and/or the cover. For example, it can be 5 mm. This distance is represented by the letter D on FIGS. 2 to 5B.

Figure 3A:
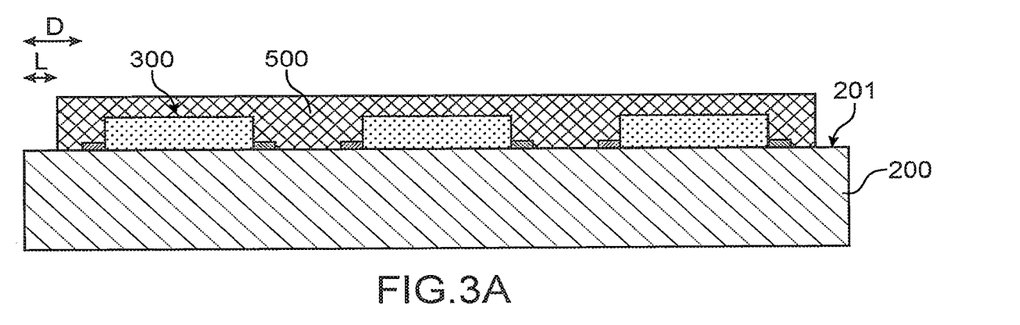
FIGS. 3A and 3B represent the position of a bonding layer on a substrate comprising microelectronic devices, according to different embodiments of the process according to the invention.
Figure 3B:
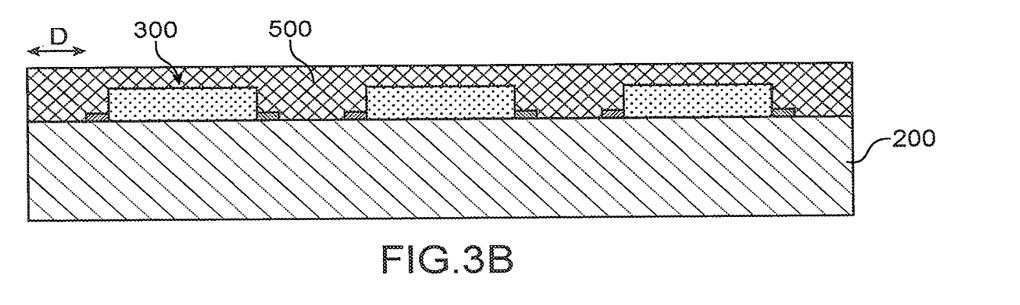

Bonding Layer 500:

As represented on FIGS. 3A and 3B, during step b), a bonding layer 500 is placed on the first principal face 201 of the support substrate 200, on each side of the microelectronic device 300.

The bonding layer 500 surrounds the microelectronic component 300, so as to form a protection barrier around the microelectronic component 300 after transfer of the encapsulation cover 400.

Advantageously, the bonding layer 500 can also mechanically absorb volumetric expansion movements generated by operation of the microbattery corresponding to insertion/deinsertion of lithium during charge and discharge cycles.

Advantageously, it protects the microbatteries from oxidants present in air (oxygen and water vapour).

It can also have etching resistance properties, and particular resistance to the chemical etching solution, to prevent the risk of infiltration of chemical products to the active layers during the thinning step The thickness of the bonding layer 500 is greater than or equal to the thickness of the microelectronic device(s) 300 to be encapsulated.

According to a first embodiment, represented on FIG. 3A, the bonding layer 500 covers the first principal face 201 of the substrate 200, except for the periphery of the first principal face 201. Advantageously, the bonding layer 500 will be positioned at a geometric distance denoted L from the edge of the substrate and/or the cover The value L is such that L<D. The value L is equal to at least the thickness of the rigid substrate and/or the rigid cover before thinning. For example, the value of the distance L is 3 mm.

According to a second embodiment, represented on FIG. 3B, the bonding layer 500 completely covers the first principal face 201 of the substrate 200. Completely means at least 90% of the total surface area of the first principal face 201 of the substrate 200. The bonding layer 500 also covers the periphery of the first principal face 201.

In these different embodiments, during step b), the bonding layer 500 may be spread on the surface of the substrate 200 comprising the microelectronic device, by any suitable technique. Different deposition techniques can be used to deposit the bonding layer 500. The spin coating deposition technique will be preferred to form a blanket bonding layer (i.e. a layer deposited over the entire surface of the substrate) using a liquid method. The viscosity of the solution will advantageously be less than 1000 cPs. The thickness of the bonding layer 500 can be varied by modifying the spin coating speed and rotation time. For example, in the case of a layer of OG198-54 epoxide, the total thickness can vary from 1 to 25 µm. A mask can be used to protect the periphery of the first principal face 201 of the substrate 200.

The bonding layer 500 is preferably obtained by polymerisation of a photopolymerisable polymer, for example under UV, or thermosetting. It may be a polymer with low viscosity (for example with viscosity of less than 2000 cPs).

The polymer is from the family of epoxides, ethers, silicones, acrylates or one of their copolymers. Commercial polymers in the Epo-Tek series cross-linked by UV or thermally can be chosen, such as the following products OG198-54, UD1355, OG653, UG1192, T7110, H70E, etc.

Alternatively, the bonding layer 500 may be an adhesive film. The adhesive film is laminated on the substrate. The adhesive film will be chosen as a function of its bond, conformability, electrical insulation properties and/or its chemical compatibility with active layers of the microbattery. It may be sensitive to pressure ("Pressure sensitive Adhesive"), to the temperature or to UV rays. It can be obtained from polymer films based on acrylic, silicone, rubber or a mixture of them. For example and non-limitatively, the insulating adhesives marketed by Tesa, Henkel, 3M, Norland or Novagard could be used. For example, a 25 µm layer of Tesa61562 adhesive marketed by the Tesa company will be used so as to solidarise the substrate and the cover. Solidarisation may be done using a rolling process at a temperature of 90° C. with a pressure of more than 1 bar and a speed of less than 3 m/minute.

One or several adhesives can be used to deposit the bonding layer 500.

The bonding layer 500 may also include particle inclusions and/or oxygen and water getters to improve their seals.

The bonding layer 500 deposited in step b) can be structured by photolithography or laser etching techniques.

According to another embodiment not shown, the bonding layer 500 may cover the first principal face 201 of the substrate 200 only partially. Preferably, the bonding layer 500 forms a sealing bead around the microelectronic device.

The sealing bead 500 is positioned such that once the cover 400 has been transferred onto the substrate 200, the bead 500 surrounds the microelectronic component 300 to be encapsulated to isolate it from the atmosphere. In the case of microbatteries 300, the sealing bead 500 is advantageously arranged at current collectors 301, 302 to save space and facilitate miniaturisation.

The sealing bead 500 is electrically non-conducting.

The sealing bead 500 may be made of a polymer material.

The sealing bead is advantageously made from a glass paste. The glass pastes comprise glass particles dispersed in an organic binder. For example, a glass paste can contain at least 70% by mass of $SiO_2$ particles. The organic binder is destroyed by heating the glass paste. Glass pastes can be vitrified at temperatures varying from 300° C. to 400° C. The vitrified glass pastes form welds. They hold the cover 400 mechanically to the substrate 200. They are also sealed against oxidants in air.

Air barrier properties of sintered glass beads are generally much better than glues.

For example, glass pastes marketed by Namics under reference DM2700P/H848, marketed by AGC (Asahi Glass Company) under references 4290D1, 5115HT1, TNS062-Z27-TP12, 5290D1 or marketed by Corning under reference Vita™ can be envisaged for making the sealing bead 500. These glass pastes are compatible with the glass materials chosen for the substrate 200 and/or for the closing and encapsulation cover 400.

Preferably, the bead 500 is made from the paste DM2700P/H848. In addition to its intrinsic barrier properties against oxidising species (values of WVTR and OTR of the order of $10^{-6}$ $gm^{-2}d^{-1}$ and $10^{-6}$ $cm^3/m^2/d$), this product has good thermal properties (CTE of $7.7\times10^{-6}$ $K^{-1}$ at 20° C.) very similar to glass materials (CET of $7.2\times10^{-6}$ $K^{-1}$ at 20° C.). Furthermore, this product can be sealed in relatively short times under laser irradiation (of the order of 60 seconds), which limits risks of propagation of heat during the sealing step.

Alternatively, other products marketed by AGC under reference 5115HT1 or by Corning under reference Vita™ can be used for making the sealing bead 500.

The thickness of the sealing bead 500 can vary from a few microns to a few hundred microns. The thickness means the dimension perpendicular to the substrate/cover stack. Its thickness will be chosen by a person skilled in the art so as to create a sufficiently large cavity between the substrate 200 and the encapsulation cover 400 so as not to disturb microbattery charge and discharge cycles, once the encapsulation process is complete. These cycles, that correspond to the lithium insertion/deinsertion phenomenon between the two electrodes, gradually lead to electrode volume expansion phenomena. Therefore it is essential to form a sufficiently high cavity to enable free vertical movement of the electrodes. The height of such a cavity depends on the difference in height between the thickness of the bead 500 and the thickness of the stack of active layers of the battery 300. Typically, the minimum value of this height is fixed at about 5% of the value of the total thickness of the microbattery 300. The width and the thickness of the sealing bead 500 are optimised as a function of the size of elements to be protected so as to efficiently reduce the size of the surface area of beads 500 relative to the total surface area of the microbattery device. The width of the sealing bead 500 shall be at least 100 μm in the case of a substrate 200 with microbatteries 300. Such dimensions satisfy the required sealing and mechanical strength properties. For example, the thickness used will be 50 μm and the width will be 100 μm.

The bead 500 can be formed on the first principal face 201 of the substrate 200 and/or on the first principal face 401 of the encapsulation cover 400 using any adapted technique (for example the use of a paintbrush, brush, screen printing or other means for application).

After the step to deposit the glass paste, the sealing bead 500 obtained is advantageously vitrified by applying a heat treatment. The treatment temperature may for example be from 100° C. to 160° C., for example of the order of 150° C. The treatment duration varies for example from a few minutes to an hour, for example of the order of 30 minutes. Advantageously, this heat treatment can degas solvents initially present in the glass paste (10 to 15% by volume).

Figure 4A:
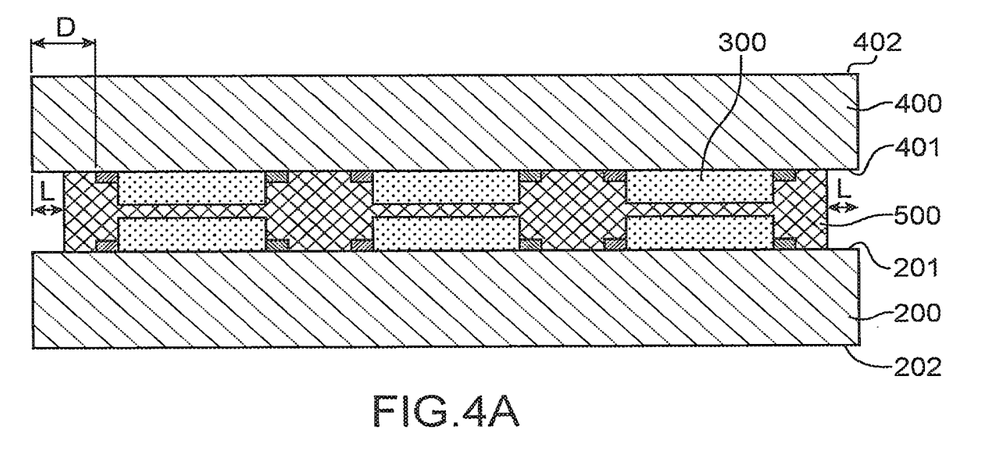
FIGS. 4A and 4B represent microelectronic devices placed on a substrate, encapsulated by a bonding layer and a protection cover, according to different embodiments of the process according to the invention.
Figure 4B:
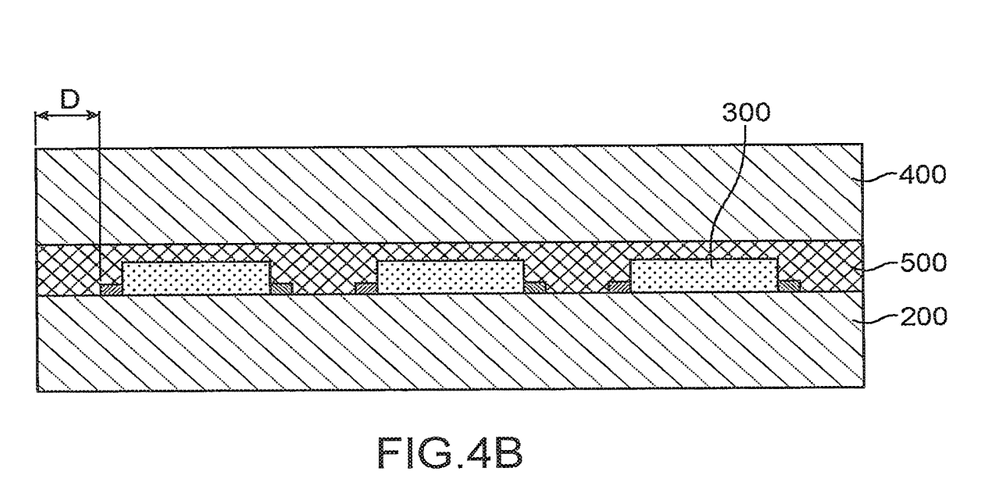

Positioning of the Encapsulation Cover 400:

As represented on FIGS. 4A and 4B, during step c), the encapsulation cover 400 is placed above the substrate 200.

A force F (a few Newtons, for example about 2 N) can be applied when positioning the cover 400 to guarantee a homogeneous contact between the bonding layer 500 and the support substrate 200 and/or the encapsulation cover 400.

An irradiation with an ultraviolet source and/or thermal heating can be used to consolidate and fix the bonding layer 500, thus enabling mechanical attachment of the support substrate 200 to the cover 400 through the bonding layer 500.

For example, the base structure is solidarised by UV insolation through the encapsulation cover using a dose of about 100 mWatt/cm² in the wavelength range between 280 nm and 800 nm during 2 minutes. UV cross-linking can be completed by thermal annealing, for example, with a duration of 20 minutes and at a temperature of 100° C.

Sealing beads are advantageously exposed to laser radiation through the upper face 402 of the encapsulation cover 400 using laser radiation to heat the sealing beads locally. Heating by laser irradiation is particularly advantageous because there is no need to heat the entire substrate 200 and cover 400. It makes it possible to heat the beads 500 locally to more than 300° C., for example from 300° C. to 400° C. so as to vitrify them and form the welds necessary for the seal. The cover 400 is thus permanently sealed on the substrate 200 containing the devices 300.

Advantageously, a laser fibre will be chosen to even more precisely localise the radiation.

The temperature increase makes the materials of the bead 500 more easily deformable by fusion effect and increases the contact surface between the bead 500 and the cover 400 or the substrate 200. The temperature can exceed 500° C. locally during the laser irradiation.

The principal characteristics of lasers will be chosen by a person skilled in the art as a function of the nature of the glass paste employed for the bead 500 and the optical properties of the cover 400. More particularly, the range of available laser wavelengths varies from infrared ($CO_2$, Nd:YAG lasers, etc.) to ultraviolet light (Excimer laser and Nd:YAG harmonics). This makes it possible to choose the most appropriate wavelength to assure efficient bonding of glass pastes. For example, a radiation at a wavelength in the near infrared range, typically 940 nm, can be chosen.

The bead 500 can be subjected to laser illumination for a duration varying from a few tens of seconds to a few hundred seconds.

The bond can be made by laser scanning. The beam can move at a speed of a few mm/s, for example of the order of 2 mm/s.

For example, a laser illumination with a power of 80 W for 60 s, with a displacement of 2 mm/s is sufficient to generate abrasion of the bead 500 so as to permanently seal the encapsulation cover with the rigid substrate containing the devices to be encapsulated.

This step is sufficient to vitrify and weld the sealing beads, to achieve mechanical cohesion and to seal the encapsulation.

The process is advantageously done in an inert environment so as to fill in the cavities delimited by the substrate 200, the cover 400 and the sealing bead 500, with an inert gas. Getters can also be used to trap oxygen and water vapour. For example, the process is performed in a glovebox.

Figure 5A:
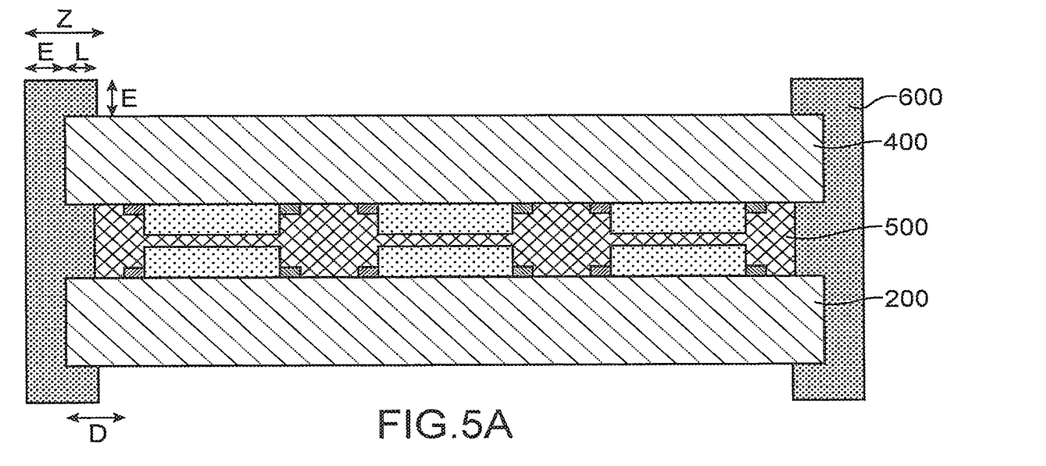
FIGS. 5A and 5B represent a substrate comprising microelectronic devices, encapsulated by a bonding layer and a protection cover, the lateral faces of the substrate and the cover being protected by a lateral protection layer, according to different embodiments of the process according to the invention.
Figure 5B:
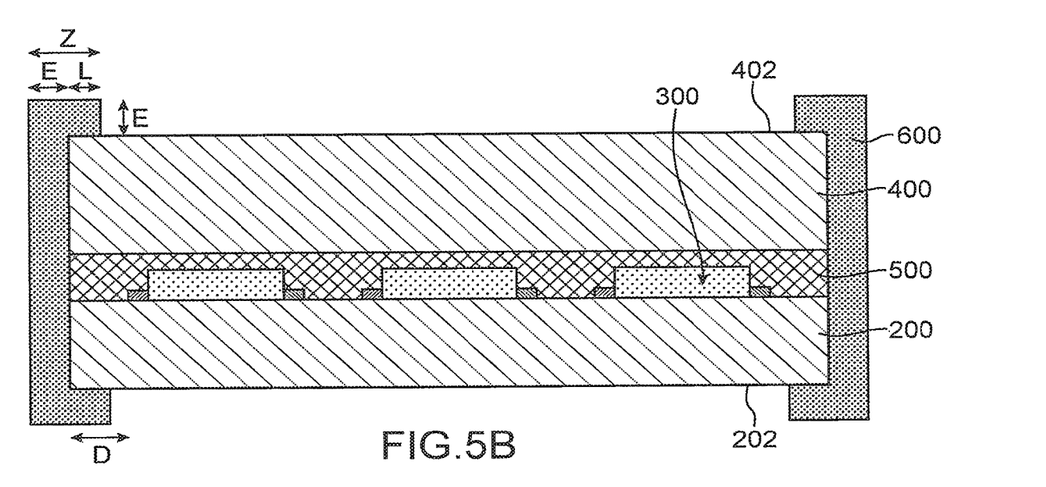

Lateral Protection Layer 600:

As represented on FIGS. 5A and 5B, a lateral protection layer 600 is deposited during step d).

The lateral protection layer 600 continuously covers the lateral faces of the support substrate 200 and the encapsulation cover 400. Preferably, it also covers the lateral faces of the bonding layer 500.

The lateral protection layer 600 masks the periphery of the second principal face 202 of the support substrate 200 and/or the second principal face 402 of the encapsulation cover 400. The lateral protection layer 600 is continuous from the periphery of the second principal face 402 of the encapsulation cover 400 as far as the periphery of the second principal face 202 of the encapsulation cover 200.

The masking zone protects the periphery of these elements during the etching step. Only unprotected zones will be etched. Since the periphery of the structure is masked by the lateral protection layer 600, a gripping zone can be created for manipulation and transfer operations during and after the end of the thinning process.

Advantageously, the lateral protection layer 600 mechanically consolidates the structure.

As represented on FIG. 5, the symbol Z defines the width of its lateral spread on the passive faces of the substrate and the cover and the symbol E defines its effective thickness.

The masking zone is advantageously positioned outside the perimeter of the microelectronic devices 300. Advantageously, the value of Z is less than the value of D in order to protect the microelectronic devices during "back-end" operations as for example during the cutting out step ("singulation"). The value E can vary up to 1 cm.

The lateral protection layer 600 is preferably made of a polymer material judiciously chosen due to its chemical resistance in the etching step. The nature of the lateral protection layer 600 will be chosen by a person skilled in the art as a function of the nature of the support substrate and/or the encapsulation cover. The lateral protection layer is made of a material resistant to etching of one of these elements.

The lateral protection layer 600 may for example by made of a polymer chosen from among epoxides, silicones, or it may be a PSA adhesive, or a UV adhesive. Polyethylene terephthalate (PET) or parylene can also be chosen. A film made of alumina, silicon oxide or silicon nitride can also be used.

The lateral protection layer 600 may also be made by a deposit of one or several physical layers of the same nature or different natures. The protection layer may also be obtained by a surface treatment, for example such as a physical deposit of thin layers, preferably a thickness of the order of 100 µm. For example, a liquid polymer will be deposited on the border and the flanks of the structure defined by the support substrate, the encapsulation cover and the adhesive film.

Figure 6A:
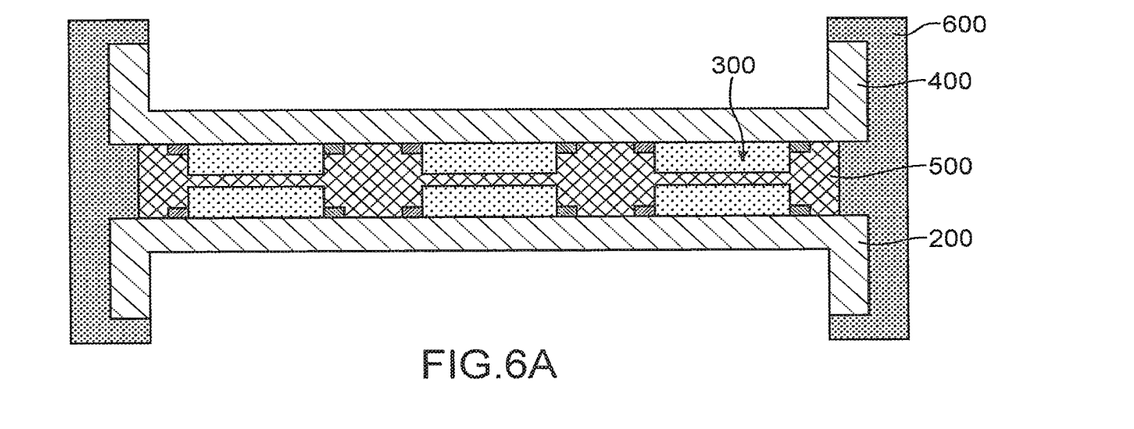
FIGS. 6A and 6B represent easily manipulated miniaturised systems comprising microelectronic devices, on a substrate, encapsulated by a protection cover, obtained after thinning of the cover and the substrate, according to different embodiments of the process according to the invention.
Figure 6B:
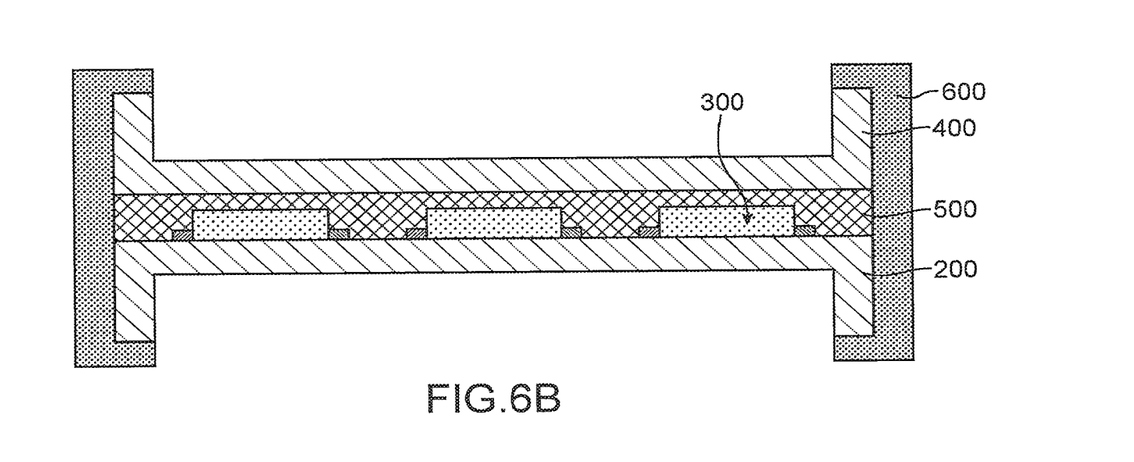

Thinning of the Support Substrate 200 and/or the Encapsulation Cover 400:

The thinning step, done in step d), can obtain a cover and/or a substrate with controlled thickness and roughness (FIGS. 6A and 6B).

Thinning is done by chemical etching (or chemical grinding). One of the major advantages of chemical grinding over mechanical grinding is the low stress generated by chemical thinning.

The etching step etches the part of the second principal face 202 of the support substrate 200 and/or the part of the second principal face 402 of the encapsulation cover 400 that are not protected by the lateral protection layer 600. Only the central part is etched. At the end of the etching step, the peripheral zone of the substrate and/or the cover is thicker than the central zone. The "raised" peripheral zone makes it easy to manipulate the assembly. The thickness of the peripheral zone corresponds to the initial thickness of the element. For example, after etching, the thickness of the peripheral zone is more than 200 µm, for example 500 µm, while the thickness of the central zone is less than 100 µm.

The solution used for chemical etching shall be chosen by a person skilled in the art so that it can be adapted to etch the second principal face 402 of the cover 400 and/or the second principal face 202 of the substrate 200.

For example, a solution with a basic nature shall be chosen to etch silicon elements. The etching solution can be potassium hydroxide (KOH) at a temperature of 80° C., so that an etching rate of the order of 1.5 µm/minute is possible. If a basic solution is used, it will be preferred to use polysiloxane type materials (silicones) for bonding the basic structure, for their resistance to basic solutions.

Etching with an acid nature will be chosen to etch glass elements. It may be a highly concentrated etching solution of hydrofluoric acid HF (49%), a mixture of HF with hydrochloric acid HCl, or a mixture of HF, water and nitric acid. For example in the case of an alkali-free glass, a chemical solution comprising a balanced mixture with 10% of hydrochloric acid (HCl) and 2% of hydrofluoric acid (HF) can give a standard etching rate (25° C.) of up to 1 µm/min. This value can be of the order of 2 µm/min for an etching solution heated to 35° C. The mixtures can be adjusted to increase the etching rate, thus a mixture of 10% HF and 37% HCl can give rates of 4 µm/min. Values of the etching rate between 20 and 30 µm/min can be achieved by adjusting the proportions of each constituent and/or by increasing the temperature.

In general, the temperature and the composition of etching solutions can be adapted depending on the materials to be etched (silicon, glass), the required final thicknesses and/or the required surface roughnesses. A chemical etching in solutions called baths can be envisaged in batch mode (dipping) or by jet (spraying) in series.

The chemical composition of liquids is adapted to the nature of the materials used for fabrication of the substrates and covers. This operation can be done individually (only one structure by advancing in line or immersion in bath), or collectively in batches of several structures at the same time.

The etching step is advantageously followed by a rinsing step with deionised water and by drying, for example under a flow of air or neutral gas. These rinsing/drying operations can be repeated many times until all residues of the acid mixture used in the etching have been completely eliminated.

When the support substrate 200 and the encapsulation cover 400 are made of the same material, for example glass, a single etching solution can be used to etch them simultaneously.

When the support substrate 200 and the encapsulation cover 400 are made of two different materials, for example one made of glass and the other silicon, two different etching solutions can be used, one after the other.

A person skilled in the art will choose a material resistant to the different etching solutions used during the process, for the lateral protection layer 600.

Formation of Electrical Contacts and/or Cutting Out of the Substrate and/or the Cover:

After the thinning step, a subsequent step is done in which the contacts are released and/or in which the different microelectronic devices are separated into individual elements.

Initially, openings are made in the encapsulation cover. This step can be done by any cutting out method known to a person skilled in the art and adapted to the materials of the substrates and/or the covers. In particular, it will be possible to use mechanical sawing for cutting out, or laser cutting ($CO_2$ laser, YAG laser, picosecond laser, femtosecond laser or excimer laser). The diameter of the openings may for example be 100 μm to 500 μm.

The openings can then be filled with an electrically conducting element such as a metal or a metal alloy, or an electrically conducting resin. For example, a resin based on electrically conducting polymers could be chosen, such as E4110 resin marketed by the Epo-Tek company. A heat treatment can then be made.

An electrically conducting film can also be rolled or electrically conducting layers can be electroplated in the openings.

Finally, the microelectronic devices are individually separated to obtain individual elements.

The process according to this invention can be used to simultaneously encapsulate in group several microelectronic devices deposited on the same substrate or on a substrate and on a cover, and more particularly it can be used to obtain miniaturised structures comprising a easily manipulated substrate and/or a thin or ultrathin cover.

Illustrative and Non-Limitative Example of One Embodiment of the Invention.

This example relates to single-step thinning of a rigid glass encapsulation cover 400 and substrate 200 comprising lithium microbatteries 300.

Step 1: Make a Stack of Microbatteries:

Several lithium microbatteries 300 were made on a 500 μm thick substrate 200 made of AF32 glass. The total thickness variation (TTV) is 1 μm. The microbatteries are about 20 μm thick. The microbatteries are made using techniques known to a person skilled in the art. The microbatteries are positioned at a distance D from the edge of the substrate equal to 5 mm.

Current collectors are firstly deposited on the substrate. The cathode, the electrolyte and the anode are then deposited successively.

The cathode is made of 20 μm thick cobalt oxide ($LiCoO_2$) obtained from a "Physical Vapour Deposition" (PVD) followed by thermal annealing at 600° C. for 10 h.

The electrolyte is a 2 μm thick layer made of LiPON.

The negative electrode is a 2 μm thick layer of lithium metal.

Step 2: Deposit the Bonding Layer 500 and Put the Encapsulation Cover 400 into Place:

An adhesive film is placed on the active face of the substrate. It is positioned at a distance L from the edge of the substrate equal to 3 mm. The adhesive film is 25 μm thick Tesa61562 marketed by the Tesa company. The film was rolled at a temperature of 90° C. with a pressure of more than 1 bar and a speed of less than 3 m/minute.

A glass encapsulation cover is positioned on the bonding layer.

Once the encapsulation cover has been put into position, a moderate force F (of the order of 2N) is applied on the encapsulation cover so as to assure a homogeneous contact between the bonding layer and the substrate containing the microbattery devices.

Step 3: Deposit the Lateral Protection Layer 600:

The lateral protection layer 600 is obtained using the NOA61 solution marketed by the Norland company. The viscosity of the solution is 300 CPs. The solution is deposited at a pressure of about 2 bars. A UV pre-annealing is then done for 5 s at a power of 100 Watts using a UV lamp in the 315 nm-550 nm range. This pre-annealing cross links and fixes the polymer on the substrate. The polymer is cured during a second UV exposure operation for 10 minutes at a power of 100 Watts. Optionally, cross-linking is completed by thermal annealing at 50° C. for 10 h.

The width Z and the thickness E of the lateral protection polymer are of the order of 4 mm and 6 mm respectively.

Figure 7A:
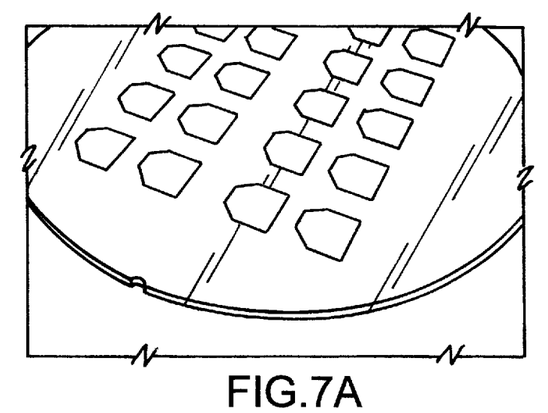
FIGS. 7A and 7B represent photographic clichés of an assembly comprising a substrate on which microelectronic devices are placed, a bonding layer and an encapsulation cover, respectively, before and after the thinning step.

The assembly is shown on FIG. 7A.

Figure 7B:
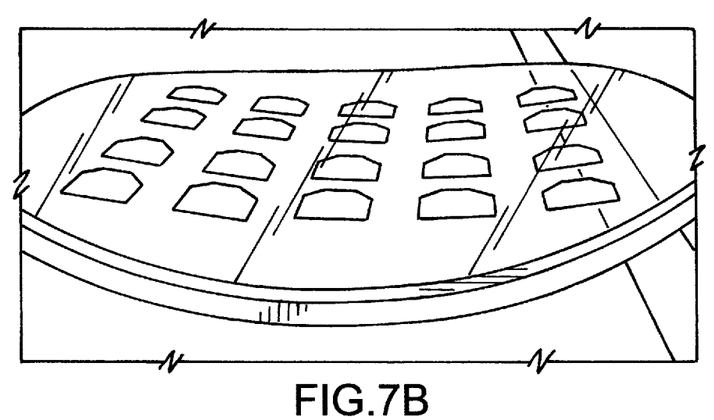
Figure 8:
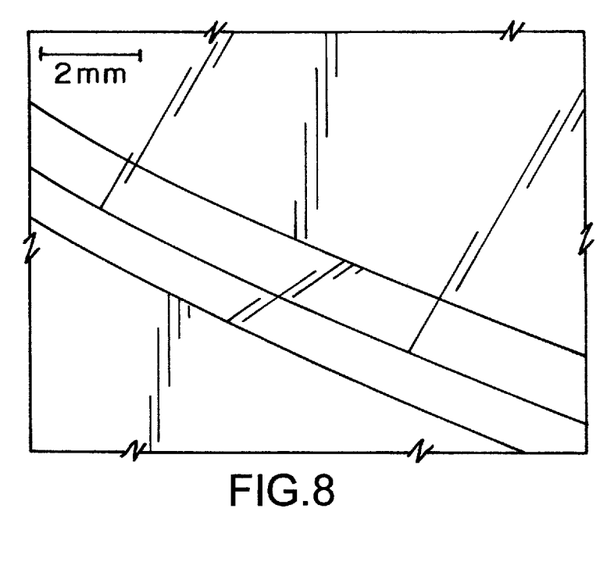
FIG. 8 is a photographic cliché obtained with the microscope of the assembly in FIG. 7B after thinning.

Step 4: Chemical Thinning of the Substrate 200 and the Cover 400:

This step is done by dipping the structure in an acid chemical bath (pH<7) composed of 10% HCl and 37% HF. The bath is heated to a temperature of 25° C. Etching is done for a duration of about 90 minutes to bring the initial thickness of the substrate and the cover from 500 μm to 50 μm, except for zones protected by the lateral protection layer. The thickness of glass in the periphery masked by the protective polymer remains unchanged (500 μm) and the mechanical integrity of the gripping zone is entirely kept, such that manipulation and transfer operations of the structure can be done (FIGS. 7B and 8).

The thinned structure is then rinsed with DI water and dried under air.

Different "back-end" steps related to the completion of microelectronic processes such as cutting out, singulation, release of electrical contacts or integration operations can be done.

Step 5: Cutting the Base Structure:

Openings and cutting out of individual components are done by making 10 passes of a picosecond laser in the visible range (530 nm) at an energy of 50 μJ.

The 300 μm diameter openings are filled with an E4110 conducting resin marketed by the Epo-Tek company. A heat treatment at 150° C. is made with a duration of 15 minutes.

The microelectronic devices are then separated.

The invention claimed is:

1. A process for encapsulation of a microelectronic device placed on a support substrate, with an encapsulation cover comprising the following successive steps:
   a) supplying the support substrate made of a first material, comprising a first principal face on which the microelectronic device is placed, a second principal face opposite the first principal face, and a lateral face,
   b) depositing a bonding layer made of a second material on the first principal face of the substrate, around the microelectronic device, c) positioning the encapsulation cover made of a third material, comprising a first principal face, a second principal face opposite the first principal face, and a lateral face on the bonding layer, so as to fix the encapsulation cover on the support substrate so as to encapsulate the microelectronic device, d) depositing a lateral protection layer made of a fourth material on the lateral face of the support substrate, on the lateral face of the encapsulation cover, on a periphery of the second principal face of the encapsulation cover, and around a periphery of the second principal face of the support substrate, the lateral protection layer delimiting a protected zone and, e) thinning of the second principal face of the support substrate and/or the second principal face of the encapsulation cover outside the protected zone, by chemical etching.

2. The process according to claim 1, wherein the first material and the third material are chosen among glass and silicon.

3. The process according to claim 1, wherein the first material and the third material are identical.

4. The process according to claim 1, wherein the first material and the third material are different.

5. The process according to claim 1, wherein, during step b), the bonding layer entirely covers the microelectronic device.

6. The process according to claim 1, wherein, during step b), the bonding layer forms a sealing bead around the microelectronic device.

7. The process according to claim 1, wherein the second material and the fourth material are polymer materials chosen from among epoxides, ethers, polysiloxanes, acrylics, copolymers thereof, and polyethylene teraphthalate.

8. The process according to claim 1 wherein, after step e), the thickness of the encapsulation cover and/or the thickness of the support substrate is less than or equal to 100 µm.

* * * * *